United States Patent
Uchida et al.

(10) Patent No.: US 9,350,196 B2
(45) Date of Patent: May 24, 2016

(54) NON-CONTACT CHARGING APPARATUS AND NON-CONTACT CHARGING METHOD

(71) Applicant: FUJITSU LIMITED, Kawasaki-shi, Kanagawa (JP)

(72) Inventors: Akiyoshi Uchida, Akashi (JP); Masakazu Taguchi, Kobe (JP); Kiyoto Matsui, Miki (JP); Hiroyasu Kawano, Ebina (JP); Satoshi Shimokawa, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 113 days.

(21) Appl. No.: 14/284,560

(22) Filed: May 22, 2014

(65) Prior Publication Data

US 2014/0253029 A1  Sep. 11, 2014

Related U.S. Application Data

(63) Continuation of application No. PCT/JP2011/077411, filed on Nov. 28, 2011.

(51) Int. Cl.
*H02J 7/00* (2006.01)
*H01F 38/14* (2006.01)
*H02J 7/02* (2016.01)
(Continued)

(52) U.S. Cl.
CPC . *H02J 7/025* (2013.01); *B60L 3/12* (2013.01); *B60L 11/182* (2013.01); *B60L 11/1824* (2013.01); *H01F 38/14* (2013.01); *H02J 5/005* (2013.01); *B60L 2210/30* (2013.01); *B60L 2210/40* (2013.01); *B60L 2270/147* (2013.01); *H03H 7/40* (2013.01); *Y02T 10/7005* (2013.01); *Y02T 10/7072* (2013.01); *Y02T 10/7241* (2013.01); *Y02T 90/12* (2013.01);
(Continued)

(58) Field of Classification Search
CPC ....................................................... H02J 7/025
USPC .......................................... 320/108; 307/104
See application file for complete search history.

(56) References Cited

U.S. PATENT DOCUMENTS

2008/0231263 A1* 9/2008 Rebmann ............... G01D 5/142
324/207.11
2010/0244580 A1  9/2010 Uchida et al.
(Continued)

FOREIGN PATENT DOCUMENTS

JP  2010-141977    6/2010
JP  2010-234878 A  10/2010
(Continued)

OTHER PUBLICATIONS

Notification of Transmittal of Translation of the International Preliminary Report on Patentability (Form PCT/IB/338, Form PCT/IB/373 & Form PCT/ISA/237), PCT/JP2011/077411, 5 pages, dated Jun. 19, 2014.
(Continued)

*Primary Examiner* — M'Baye Diao
(74) *Attorney, Agent, or Firm* — Fujitsu Patent Center

(57) ABSTRACT

A non-contact charging apparatus configured to, vary the inductance and the capacitance of the matching unit for matching the impedance of the power supply system that supplies alternate current power and the impedance of the power transmitting/receiving system including a power transmitting unit and a power receiving apparatus according to the variable information.

5 Claims, 18 Drawing Sheets

(51) Int. Cl.
*H02J 5/00* (2016.01)
*B60L 11/18* (2006.01)
*B60L 3/12* (2006.01)
*H03H 7/40* (2006.01)

(52) U.S. Cl.
CPC ............ *Y02T 90/121* (2013.01); *Y02T 90/122* (2013.01); *Y02T 90/127* (2013.01); *Y02T 90/14* (2013.01)

(56) References Cited

U.S. PATENT DOCUMENTS

| | | | |
|---|---|---|---|
| 2011/0208474 A1 | 8/2011 | Tanabiki et al. | |
| 2011/0241440 A1* | 10/2011 | Sakoda | H02J 5/005 307/104 |
| 2012/0001485 A1 | 1/2012 | Uchida | |
| 2012/0299389 A1* | 11/2012 | Lee | H04B 5/0031 307/104 |
| 2013/0015720 A1 | 1/2013 | Shimokawa et al. | |
| 2014/0159502 A1* | 6/2014 | Shimokawa | H02J 17/00 307/104 |

FOREIGN PATENT DOCUMENTS

| | | |
|---|---|---|
| JP | 2010-252497 A | 11/2010 |
| WO | 2010/061566 | 6/2010 |
| WO | 2010/067763 | 6/2010 |
| WO | 2010/116441 | 10/2010 |
| WO | 2011/099071 | 8/2011 |

OTHER PUBLICATIONS

Extended European Search Report dated Mar. 24, 2015 for corresponding European Patent Application No. 11876697.1, 5 pages.

International Search Report of PCT/JP2011/077411 mailed on Feb. 28, 2012.

Mizugaki, Kenichi et al., "22-cm Accurate Location System with 1-cc Small Size Sensor Node: Practical Experiment of UMB Location System," 2006 Meeting of IEICE (The Institute of Electronics, Information and Communication Engineers) Engineering Sciences Society, pp. S-55 to S-56, with Partial English Translation.

* cited by examiner

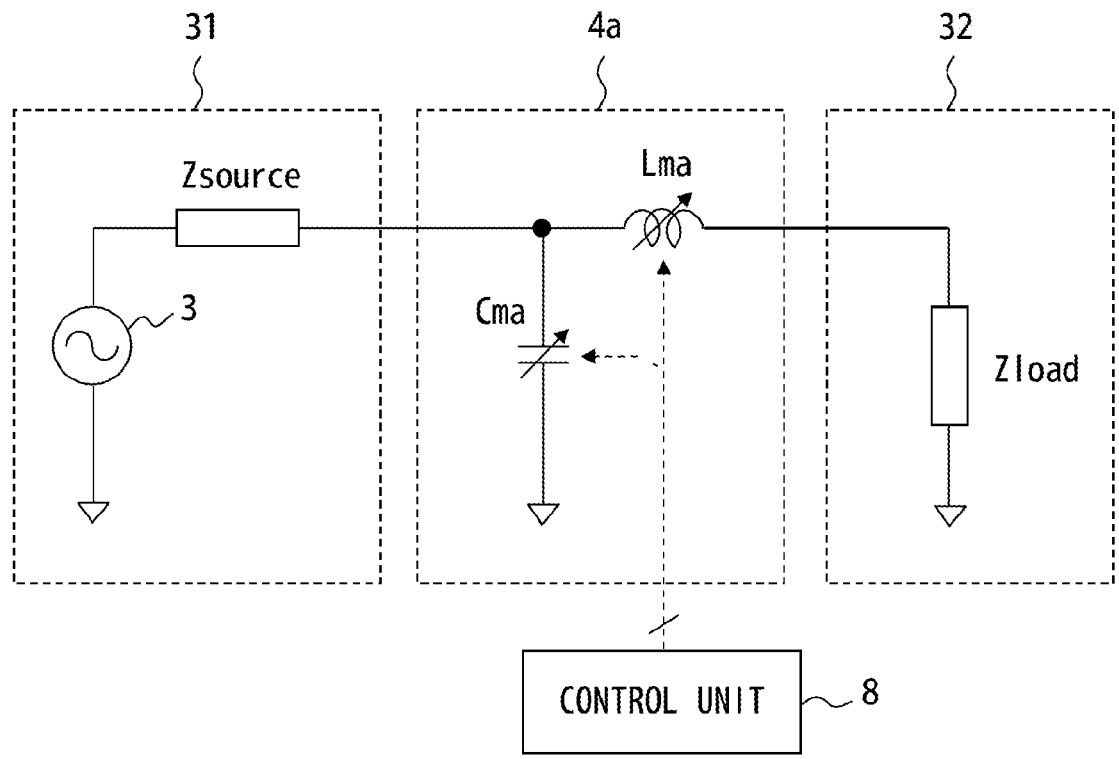
F I G. 3 A

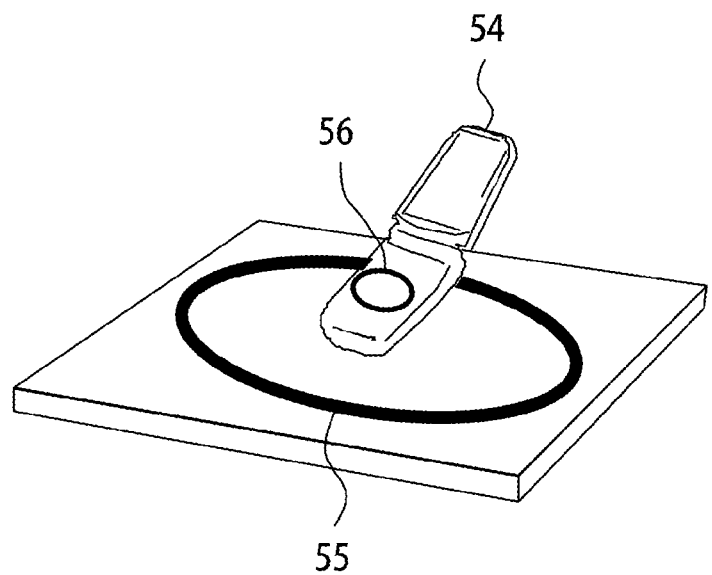
F I G. 5B

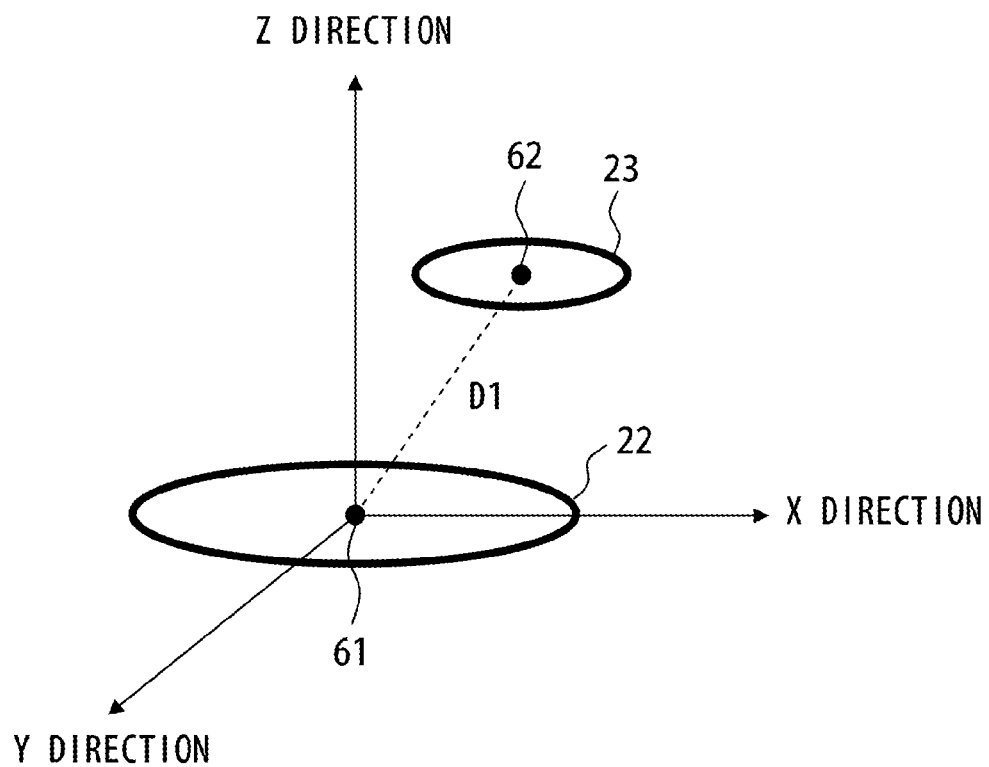
F I G. 6

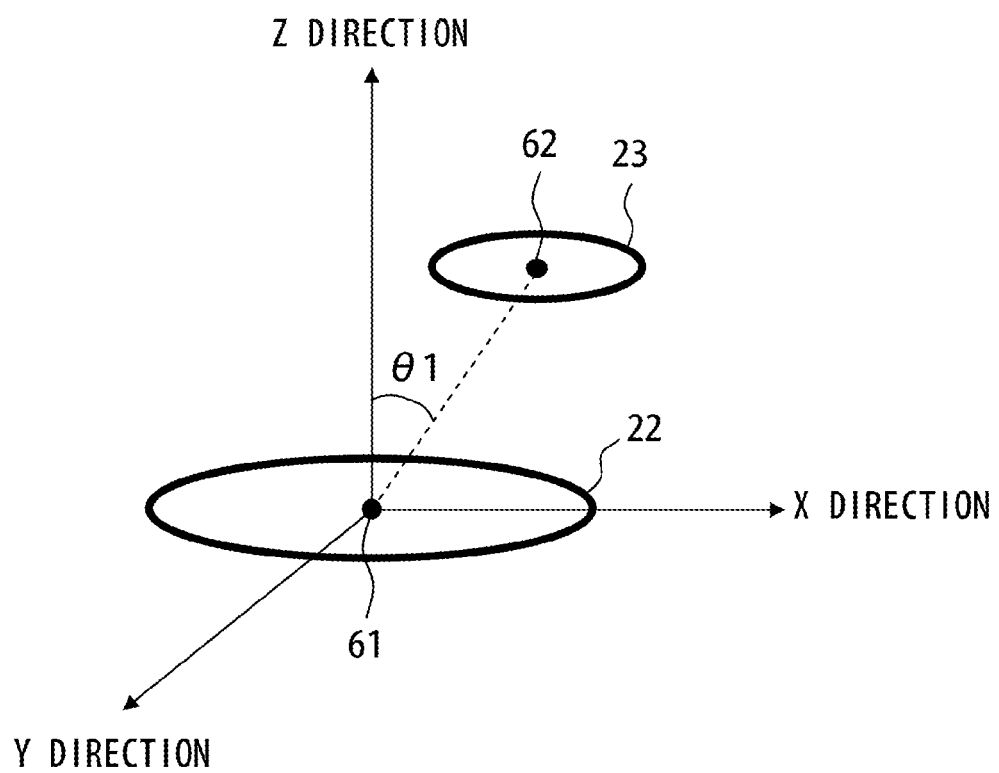
F I G. 7A

81

| IDENTIFICATION INFORMATION | DISTANCE D2 |
|---|---|
| ID1 | kyori1z |
| ID2 | kyori2z |
| ID3 | kyori3z |
| ID4 | kyori4z |
| ID5 | kyori5z |
| ID6 | kyori6z |
| ID7 | kyori7z |
| ID8 | kyori8z |
| ID9 | kyori9z |
| ⋮ | ⋮ |

Table 91:

| DISTANCE D1 | DISTANCE D2 | VARIABLE INFORMATION | |
|---|---|---|---|
| | | CAPACITANCE | INDUCTANCE |
| kyori1 | kyori1z | C11 | L11 |
| | kyori2z | C12 | L12 |
| | ... | ... | ... |
| kyori2 | kyori1z | C21 | L21 |
| | kyori2z | C22 | L22 |
| | ... | ... | ... |
| ... | ... | ... | ... |
| kyori6 | kyori1z | C61 | L61 |
| | kyori2z | C62 | L62 |
| | ... | ... | ... |
| kyori7 | kyori1z | C71 | L71 |
| | kyori2z | C72 | L72 |
| | ... | ... | ... |
| .... | .... | .... | .... |

Table 92:

| ANGLE θ1 | DISTANCE D2 | VARIABLE INFORMATION | |
|---|---|---|---|
| | | CAPACITANCE | INDUCTANCE |
| kakudo1 | kyori1z | C11 | L11 |
| | kyori2z | C12 | L12 |
| | ... | ... | ... |
| kakudo2 | kyori1z | C21 | L21 |
| | kyori2z | C22 | L22 |
| | ... | ... | ... |
| ... | ... | ... | ... |
| kakudo6 | kyori1z | C61 | L61 |
| | kyori2z | C62 | L62 |
| | ... | ... | ... |
| kakudo7 | kyori1z | C71 | L71 |
| | kyori2z | C72 | L72 |
| | ... | ... | ... |
| .... | .... | .... | .... |

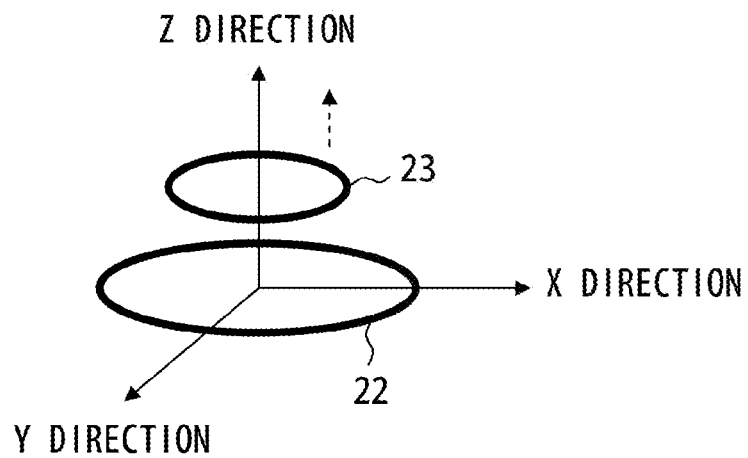
F I G. 1 2 A

NON-CONTACT CHARGING APPARATUS AND NON-CONTACT CHARGING METHOD

CROSS-REFERENCE TO RELATED APPLICATION

This application is a continuation application of International Application PCT/JP2011/077411 filed on Nov. 28, 2011 and designated the U.S., the entire contents of which are incorporated herein by reference.

FIELD

The present invention relates to a non-contact charging apparatus and a non-contact charging method used for non-contact charging.

BACKGROUND

Conventionally, as non-contact charging techniques of a strongly-coupled system using the alternate current, for example, systems using electromagnetic induction, electric-field coupling, magnetic-field resonance, electric-field resonance and the like have been known. Then, in a non-contact charging apparatus used in the non-contact charging techniques of a strongly-coupled system using the alternate-current mentioned above, the matching of the impedance of the electric power-supply system that supplies the alternate-current power and the impedance determined by the power transmitting unit and the power receiving apparatus (power transmitting/receiving system) is essential. That is, without the impedance matching, a reflected power is generated between the power supply unit and the power transmitting unit and affects the power supply system. In addition, due to the influence of the reflected power, it leads to Electromagnetic Interference (EMI) to the peripheral devices. Furthermore, it also reads to a decrease in the efficiency in the non-contact charging apparatus. Particularly, the influence is significant when a large electric power is transmitted. For example, charging to a battery mounted on an electric vehicle and a hybrid vehicle may be considered.

As a related art, a non-contact power transmitting apparatus including an alternate-current power source, a primary coil connected to the alternate-current power source, a primary-side resonance coil, a secondary-side resonance coil, a secondary coil to which a load is connected, and an impedance variable circuit provided between the secondary coil and the load has been known. The primary coil, the primary-side resonance coil, the secondary-side resonance coil, the secondary coil, the load and the impedance variable circuit constitute a resonance system. The alternate-current power source outputs an alternate-current voltage in a frequency equal to the resonance frequency of the resonance system. The impedance of the impedance variable circuit is adjusted so as to suppress the change of the input impedance of the resonance system. As a result, even when at least one of the distance or the load between the two resonance coils change, it is possible to supply the electric power from the alternate-current power source to the load with a good efficiency, without changing the frequency of the alternate-current output voltage of the alternate-current power source.

Patent document 1: Japanese Laid-open Patent Publication 2010-141977

SUMMARY

According to an aspect of the embodiment, A non-contact charging apparatus includes a matching unit, a measuring unit, a control unit. The matching unit matches the impedance of a power supply system that supplies alternate-current power and the impedance of a power transmitting/receiving system including a power transmitting unit and a power receiving apparatus.

The measuring unit measures the first distance representing length of a line segment connecting the position of the center point of a power transmitting resonance coil in a shape in axial symmetry in the power transmitting unit, and the position of the center point of a power receiving resonance coil in a shape in axial symmetry in the power receiving apparatus.

Using information to identify an apparatus having the power receiving apparatus, the control unit refers to distance information and selects the second distance. The distance information includes pieces of identification information to identify plurality of apparatuses which include the power receiving apparatus, and the second distance that is a distance between a plane having the power transmitting resonance coil and a plane having the power receiving resonance coil determined according to each type of the apparatus associated with each of the pieces of the identification information, and is stored in a storing unit. Meanwhile, using the first distance and the second distance, the control unit refers to matching information and selects variable information. The matching information includes a combination of the first distance and the second distance, and the variable information associated with the combination of the first distance and the second distance, and is stored in the storing unit. The variable information is information for varying the inductance and the capacitance of the matching unit for matching the impedance of the power supply system and the impedance of the power transmitting/receiving system that changes according to the relative positions of the power transmitting resonance coil and the power receiving resonance coil. In addition, the control unit varies the inductance and the capacitance of the matching unit according to the variable information.

Meanwhile, the measuring unit of the non-contact charging apparatus may also measure the angle between a line segment connecting the position of the center point of the power transmitting resonance coil in a shape in axial symmetry in the power transmitting unit and the position of the center point of the power receiving resonance coil in the power receiving apparatus, and a line segment that is the axis of the axial symmetry from the center point of the power transmitting resonance coil.

In the case of using the angle, the control unit may refer to the matching information and select the variable information, using the angle and the second distance. The matching information includes a combination of the angle and the second information, and variable information associated with the combination of the angle and the second distance, and is stored in the storing unit. The variable information is information to vary the inductance and the capacitance of the matching unit for matching the impedance of the power supply system and the impedance of the power transmitting/receiving system that changes according to the relative positions of the power transmitting resonance coil and the power receiving resonance coil.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIGS. 3A and 3B are diagrams illustrating an example of the impedance matching of a matching unit.

FIGS. 5A and 5B are diagrams illustrating an example of a non-contact charging apparatus that transmits power to a power receiving apparatus mounted on a vehicle or an electronic device.

FIG. 6 is a diagram illustrating an example of the measurement of a distance D1.

FIGS. 7A and 7B are diagrams illustrating an example of the measurement of an angle θ1.

FIG. 8 is a diagram illustrating an example of the data structure of distance information FIG. 9 is a diagram illustrating an example of the data structure of matching information.

FIGS. 12A and 12B are diagrams illustrating the impedance, the reflected power and the efficiency in a case in which a power receiving resonance coil move in the Z direction.

DESCRIPTION OF EMBODIMENTS

Figure 1:
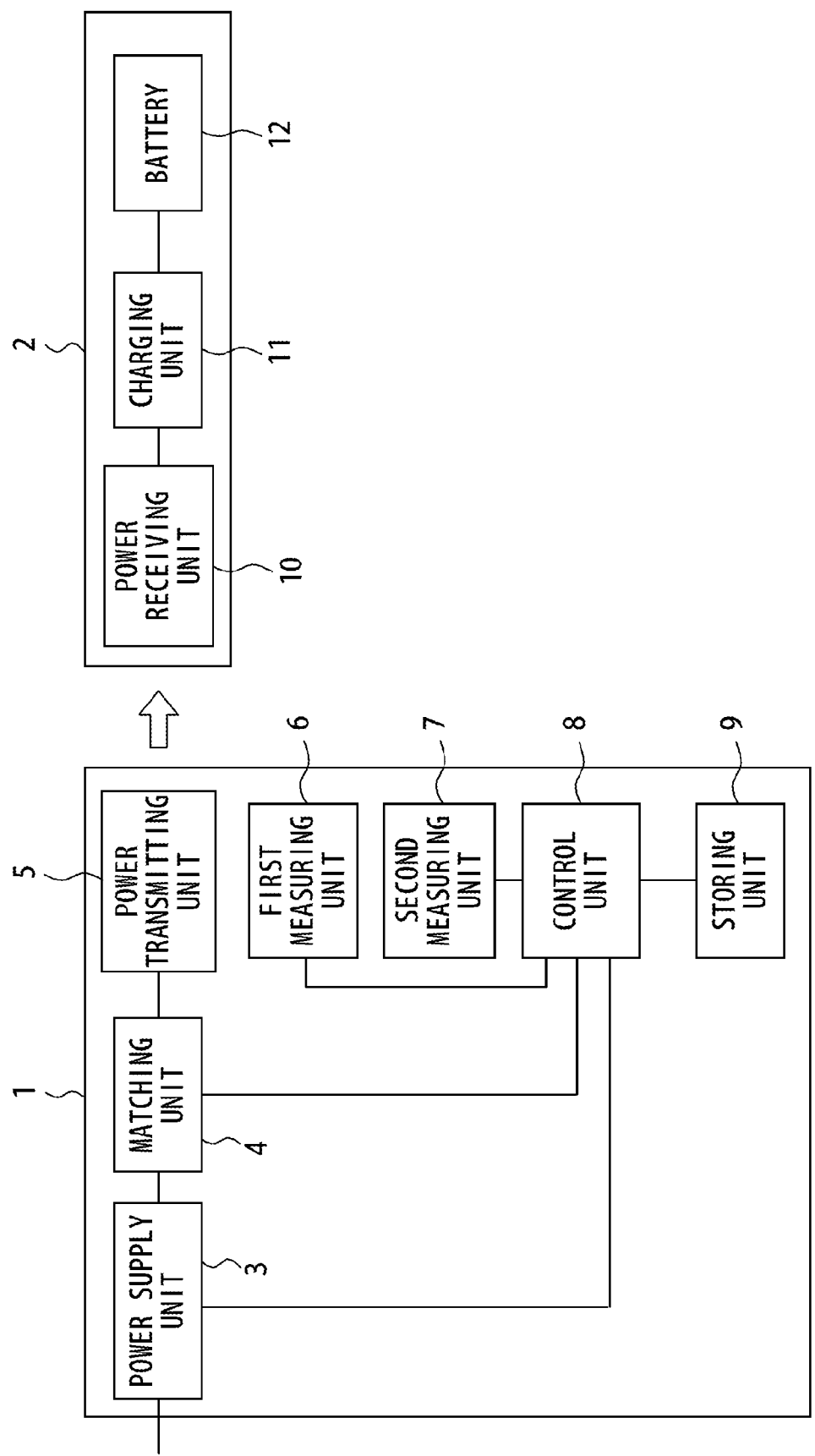
FIG. 1 is a diagram illustrating an example of a non-contact charging apparatus and a power-receiving apparatus of embodiment 1.

A non-contact charging apparatus and a power receiving apparatus of a strongly-coupled system are explained. For example, when a non-contact charging apparatus of magnetic field resonance transmits power to a power receiving apparatus in a non-contact manner, according to the relative positional relationship of a power transmitting resonance coil included in the power transmitting system used for power transmission and a power receiving resonance coil included in the power receiving system, the impedance of the power transmitting/receiving system including the power transmitting system and the power receiving system changes. That is, when the relational position is fixed, the impedance of the power transmitting/receiving system is constant, and therefore, the matching of the impedance of the power supply system that supplies power to the power transmitting system and the impedance of the power transmitting/receiving system may be uniquely determined. However, it is expected that, when actually transmitting power from a non-contact charging apparatus to the power receiving apparatus, the relative positions is not necessarily fixed. In addition, when the relative positions is not fixed and changes freely, between the power transmitting resonance coil and the power receiving resonance coil, as a degree of freedom to decide the relative positions, there are angles θx, θy, θz indicating the rotation around three axes, an X axis and a Y axis representing the plain face, and a Z axis representing the height, respectively.

Therefore, in the present embodiment, of six parameters of the degree of freedom regarding the relative positions of the power transmitting resonance coil and the power receiving resonance coil, five are constrained.

The power transmitting resonance coil and the power receiving resonance coil are made to be in a shape in axial symmetry.

The power transmitting resonance coil and the power receiving resonance coil are arranged in parallel.

The distance (height) between the power transmitting resonance coil and the power receiving resonance coil in the Z axis direction is fixed.

That is, by imposing the constrains above, the power transmitting resonance coil and the power receiving resonance coil in a shape in axial symmetry are arranged in parallel, and therefore, the three parameters, the angles θx, θy, θz no longer need to be measured. Furthermore, the distance (height) in the Z axis direction may also be determined by the shape of the power receiving apparatus having the power receiving the resonance coil, and therefore, the distance in the Z axis direction may be determined according to the type of the power receiving apparatus. Therefore, the distance in the Z axis direction no longer needs to be measured either. In addition, considering the center of the power transmitting resonance coil as the origin, the X axis and the Y axis may be regarded as equivalent, and therefore, five of the six parameters of the degree of freedom may be regarded as known. As a result, it is possible to obtain the six parameters of the degree of freedom by measuring one axis only. That is, the relative positions may expressed by the measured one axis and the distance in the Z axis direction determined in advance.

Here, to make a shape in axial symmetry means that, for example, when a square coil is used as the power transmitting resonance coil or the power receiving resonance coil, and a side of the coil as L, the area of the square coil may be approximated to a circular coil in a shape in axial symmetry having the same area as the area L×L of the square. That is, the square coil is handled as a circular coil with a diameter of $2L/(\pi^{\wedge}0.5)$.

In addition, assuming a side of a coil in a regular octagonal shape as L, approximating to a circular coil in a shape in axial symmetry having the same area as area 2(L×L)/tan 22.5 of the regular octagon will do. That is, the regular octagonal coil is handled as a circular coil with a diameter of $2L\times(2/\pi \tan 22.5)^{\wedge}0.5)$.

As described above, regarding the power transmitting and the power receiving resonance coils, the shape in axial symmetry includes a shape that may not a perfect circle, but may be calculated by approximating to a circle, while there is a possibility for a decrease in the accuracy.

Next, the constant of the circuit that performs the matching of the impedance of the power supply system and the impedance of the power transmitting/receiving system is determined using the obtained relative positions. For example, in the case of a matching circuit that performs the impedance matching by a coil and a capacitor, a constant to vary the inductance and the capacitance according to the obtained relative positions is determined.

Hereinafter, based on the drawings, details of the embodiments of the present inventions are explained.

FIG. 1 is a diagram illustrating an example of a non-contact charging apparatus and a power receiving apparatus. The non-contact charging apparatus 1 includes a power supply unit 3, a matching unit 4, a power transmitting unit 5, a first measuring unit 6, a second measuring unit 7, a control unit 8, and a storing unit 9. The power receiving apparatus 2 includes a power receiving unit 10, a charging unit 11, and a battery 12.

The power supply unit 3 generates transmitting power of a power transmitting frequency for transmitting power to the power receiving apparatus 2, using power supplied from an external power source, and outputs it to the matching unit 4. The power transmitting frequency is the same frequency as the resonance frequency of a resonance circuit that the power transmitting unit 5 has and a resonance circuit that the power receiving unit 10 has, described later. However, the resonance frequency and the power transmitting frequency are never the same in reality, and therefore, when the resonance frequency and the power transmitting frequency are within a range set in advance, they are regarded as the same. Meanwhile, the power supply unit 3 includes an oscillator circuit and a power transmitting amplifier, for example. The oscillator circuit generates the resonance frequency. The power transmitting amplifier makes the power supplied from the external power source into the transmitting power of the power transmitting frequency generated in the oscillator circuit, and transmits it to the matching unit 4.

The matching unit 4 matches the impedance of the power supply unit 3 (power supply system) and the impedance of the power transmitting unit 5 and the power receiving apparatus 2 (power transmitting/receiving system). The matching unit 4 performs the impedance matching by varying the inductance or the capacitance using a circuit including a variable coil and a variable capacitor and the like, for example. Alternatively, the impedance matching may be performed by changing the inductance or the capacitance by switching a plurality of switches and the like connected to a plurality of coils or a plurality of capacitors. The impedance matching may be considered to be performed by varying the inductance or the capacitance by a control signal from the control unit 8 described later.

Figure 2:
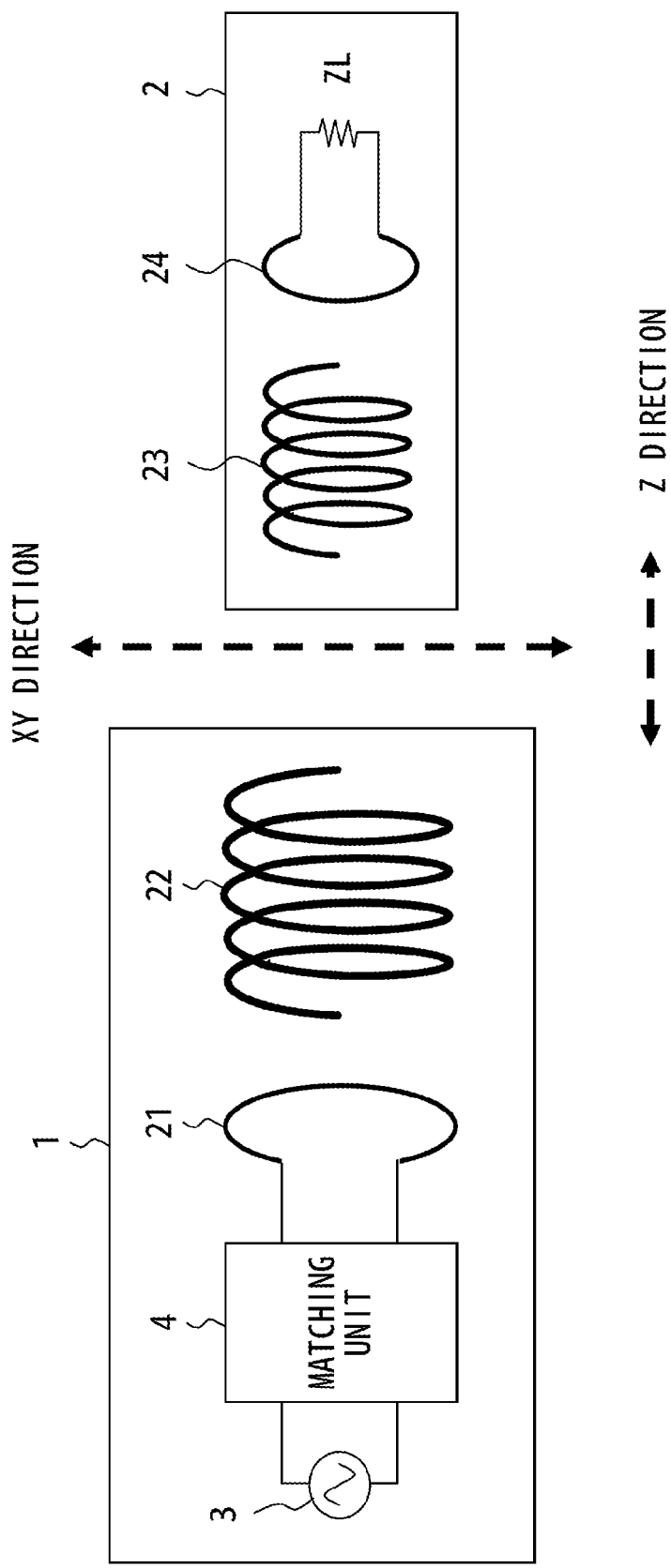
FIG. 2 is a diagram illustrating an example of a strongly-coupled non-contact charging apparatus and a power receiving apparatus.

The power transmitting unit 5 includes a power supply coil 21 and a power transmitting resonance coil 22 illustrated in FIG. 2, and transmits the transmitting power supplied from the matching unit 4 to the power receiving unit 10 of the power receiving apparatus 2. Meanwhile, when the power supply coil 21 is not used, the transmitting power is supplied to the power transmitting resonance coil 22 from the matching unit 4.

The first measuring unit 6 (measuring unit) measure a distance D1 or an angle θ1 between the power transmitting unit 5 and the power receiving unit 10. For example, as the distance D1 between the power transmitting unit 5 and the power receiving unit 10, measuring the distance between the center of the power transmitting resonance coil 22 and the center of the power receiving resonance coil 23 may be considered. As a measurement method, for example, a method using Ultra Wide Band communication, a method using a laser length measuring device, and the like, may be considered. Meanwhile, the measurement of the distance D1 is not limited to the methods mentioned above. Regarding the method using Ultra Wide Band communication, see MIZUGAKI Kenichi, and 13 others, "22-cm Accurate Location System with 1-cc Small Size Sensor Node: Practical Experiment of UWB Location System", Proceedings of the Society Conference of IEICE, Vol. 2006, pp. S-S55.

As the angle θ1 between the power transmitting unit 5 and the power receiving unit 10, for example, measuring the angle between the center of the power transmitting resonance coil 22 and the center of the power receiving resonance coil 23 may be considered. As a measurement method, for example, a method using a camera, and the like, may be considered. Meanwhile, the measurement of the angle θ1 is not limited to the method mentioned above, as long as the angle θ1 may be measured.

The second measuring unit 7 measures a distance D2 (or the height) between the power transmitting unit 5 and the power receiving unit 10. For example, measuring of the distance between a plane (plain face) of the power transmitting resonance coil 22 and a plane (plain face) of the power receiving resonance coil 23 may be considered. Meanwhile, when the non-contact charging apparatus and the power receiving apparatus are known, the distance D2 may be stored in the storing unit 9.

The control unit 8 controls the respective units of the non-contact charging apparatus 1. The control unit 8 refers to distance information and selects the second distance, using information to identify an apparatus that has the power receiving apparatus 2. The distance information includes identification information to identify a plurality of apparatuses having the power receiving apparatus 2, and the second distance which is the distance between the plane having the power transmitting resonance coil 22 and the plane having the power receiving resonance coil 23 determined by the respective types of apparatuses associated with the respective pieces of the identification information, and is stored in the storing unit. In addition, the control unit 8 refers to matching information, selects variable information, and varies the inductance and the capacitance of the matching unit 4 according to the variable information, using the first distance and the second distance. The matching information includes the combination of the first distance and the second distance, and variable information for varying the inductance and the capacitance of the matching unit associated with the combination of the first distance and the second distance, and is stored in the storing unit 9. The variable information is information for matching the impedance of the power supply system and the impedance of the power transmitting/receiving system that changes according to the relative positions of the power transmitting resonance coil and the power receiving resonance coil.

Meanwhile, as the control unit 8, using a Central Processing Unit (CPU), a multicore CPU, a programmable device (a Field Programmable Gate Array (FPGA), a Programmable Logic Device (PLD), and the like) may be considered.

The storing unit 9 stores the distance information, the matching information, and the like. As the storing unit 9, a memory, a hard disk and the like, for example, a Read Only Memory (ROM), a Random Access Memory (RAM), and the like, may be considered. Meanwhile, the storing unit 9 may record data such as the parameter value, the variable value, and the like, or may be used as a work area at the time of execution.

The power receiving unit 10 includes the power receiving resonance coil 23 and a power taking out coil 24 illustrated in FIG. 2. The power receiving unit 10 receives the power from the power transmitting unit 5 and outputs it to the charging unit 11.

The charging unit 11 includes a rectifier circuit connected to the power receiving unit, and charges the received alternate-current transmitting power. Meanwhile, when the power taking out coil 24 is not used, the charging unit 11 is connected directly to the power receiving resonance coil of the power receiving unit 10. Meanwhile, a rectifier circuit is used as a circuit of the charging unit 11 to charge the battery 12 in this example, but the battery may also be charged using another charging circuit.

As the battery 12, for example, a lithium-ion secondary battery, a nickel-metal hydride secondary rechargeable battery, and the like, may be considered.

Power transmitting/receiving is explained.

FIG. 2 is a diagram illustrating an example of a non-contact charging apparatus and a power receiving apparatus of a strongly-coupled system. The system including the non-contact charging apparatus 1 and the power receiving apparatus 2 illustrated in FIG. 2 is a system that supplies power from the non-contact charging apparatus 1 to the power receiving apparatus 2 using magnetic field resonance or electric field resonance. In the non-contact charging apparatus 1 illustrated in FIG. 2, the power supply unit 3, the matching unit 4, the power transmitting resonance coil 22 are illustrated. Meanwhile, in the power receiving apparatus 2, the power receiving resonance coil 23, the power taking out coil 24, a load ZL are illustrated. The power supply unit 3 of the non-contact charging apparatus 1 supplies power to the power transmitting resonance coil 22 via the matching unit 4 and the power supply coil 21. The power supply unit 3 includes, for example, an oscillator circuit, and supplies power supplied from an external power source to the power supply coil 21 via the matching unit 4, at a resonance frequency that generates resonance between the power transmitting resonance coil 22 and the power receiving resonance coil 23. The matching unit 4 is described later.

As the power supply coil 21, a circuit that supplies power supplied from the power supply unit 3 to the power transmitting resonance coil 22 by electromagnetic inductance. Meanwhile, the power supply coil 21 and the power transmitting resonance coil 22 are placed at positions sufficient to supply power by electromagnetic inductance.

As the power transmitting resonance coil 22, for example, a circuit including a helical-type coil may be considered. Meanwhile, the power transmitting resonance coil 22 may be expressed by an LC resonance circuit, and the resonance frequency of the power transmitting resonance coil 22 (power transmitting frequency f0) may be expressed by expression 1.

$$f0 = 1/2\pi\sqrt{La \cdot Ca} \qquad \text{expression 1}$$

f0: the resonance frequency of the power transmitting resonance coil
La: the inductance of the power transmitting resonance coil
Ca: the capacitance of the power transmitting resonance coil As the power receiving resonance coil 23, for example, a circuit including a helical-type coil may be considered. Meanwhile, the power receiving resonance coil 23 may be expressed by an LC resonance circuit. Meanwhile, each power receiving resonance coil 23 may be expressed by an LC resonance circuit, and the resonance frequency f1 of the power receiving resonance coil 23 may be expressed by expression 1.

$$f1 = 1/2\pi\sqrt{Lb \cdot Ca} \qquad \text{expression 2}$$

f1: the resonance frequency of the power receiving resonance coil
Lb: the inductance of the power receiving resonance coil
Cb: the capacitance of the power receiving resonance coil As the power taking out coil 24, a circuit that takes out power from the corresponding power receiving resonance coil 23 by electromagnetic inductance. Meanwhile, the power receiving resonance coil 23 and the corresponding power taking out coil 24 are placed at positions sufficient to supply power by electromagnetic inductance.

The load ZL is connected to the power taking out coil 24. The load ZL is, for example, a battery and the like. In reality, a rectifier circuit, an AC-DC converter, and the like, for converting the alternate current to the direct current are connected in the precedent stage of the load ZL. In addition, a voltage converts the voltage into a prescribed voltage value, a transformer, a detection circuit that monitors the charged amount, and the like, may be connected as well.

The matching unit 4 is explained.

Figure 3B:
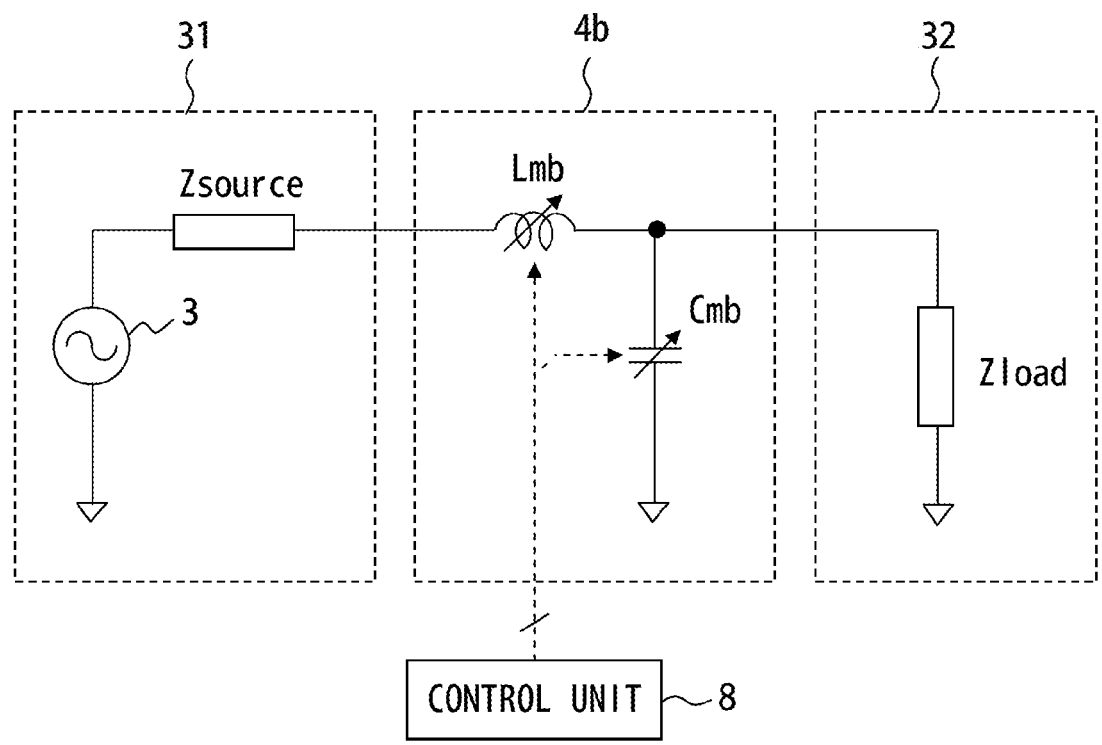

FIGS. 3A and 3B are diagrams illustrating an example of the impedance matching of the matching unit. In FIG. 3A, the power supply system 31, the matching unit 4a, the power transmitting/receiving system 32, and the control unit 8 are illustrated. Input impedance Zsource from the viewpoint of the matching unit 4a is determined by the power supply unit 3 included in the power supply system 31 and the wiring resistance, and the like. Output impedance Zload from the viewpoint of the matching unit 4a is determined by the power transmitting/receiving system 32 that includes the power transmitting unit 5 and the power receiving apparatus 2, and the like in FIG. 1. The output impedance Zload changes according to the relative positions of the power transmitting resonance coil 22 and the power receiving resonance coil 23, and the like.

The matching unit 4a is a matching circuit including a variable capacitor Cma and a variable coil Lma. The control unit 8 performs matching of the impedances of the power supply system 31 and the power transmitting/receiving system 32 using variable information to vary the capacitance of the variable capacitor Cma and the inductance of the variable coil Lma that are associated to the relative positions. In this example, the variable capacitor Cma and the variable coil Lma are used, but as long as the circuit is able to perform the impedance matching, it is not a limitation.

FIG. 3B illustrates the power supply system 31, the matching unit 4b, the power transmitting/receiving system 32 and the control unit 8. The matching unit 4b is a matching circuit including a variable capacitor Cmb and a variable coil Lmb. The control unit 8 performs the matching of the impedances of the power supply system 31 and the power transmitting/receiving system 32 using variable information to vary the capacitance of the variable capacitor Cmb and the inductance of the variable coil Lmb. In this example, the variable capacitor Cma and the variable coil Lmb are used, but as long as the circuit is able to perform the impedance matching, it is not a limitation.

The operation of the control unit is explained.

Figure 4:
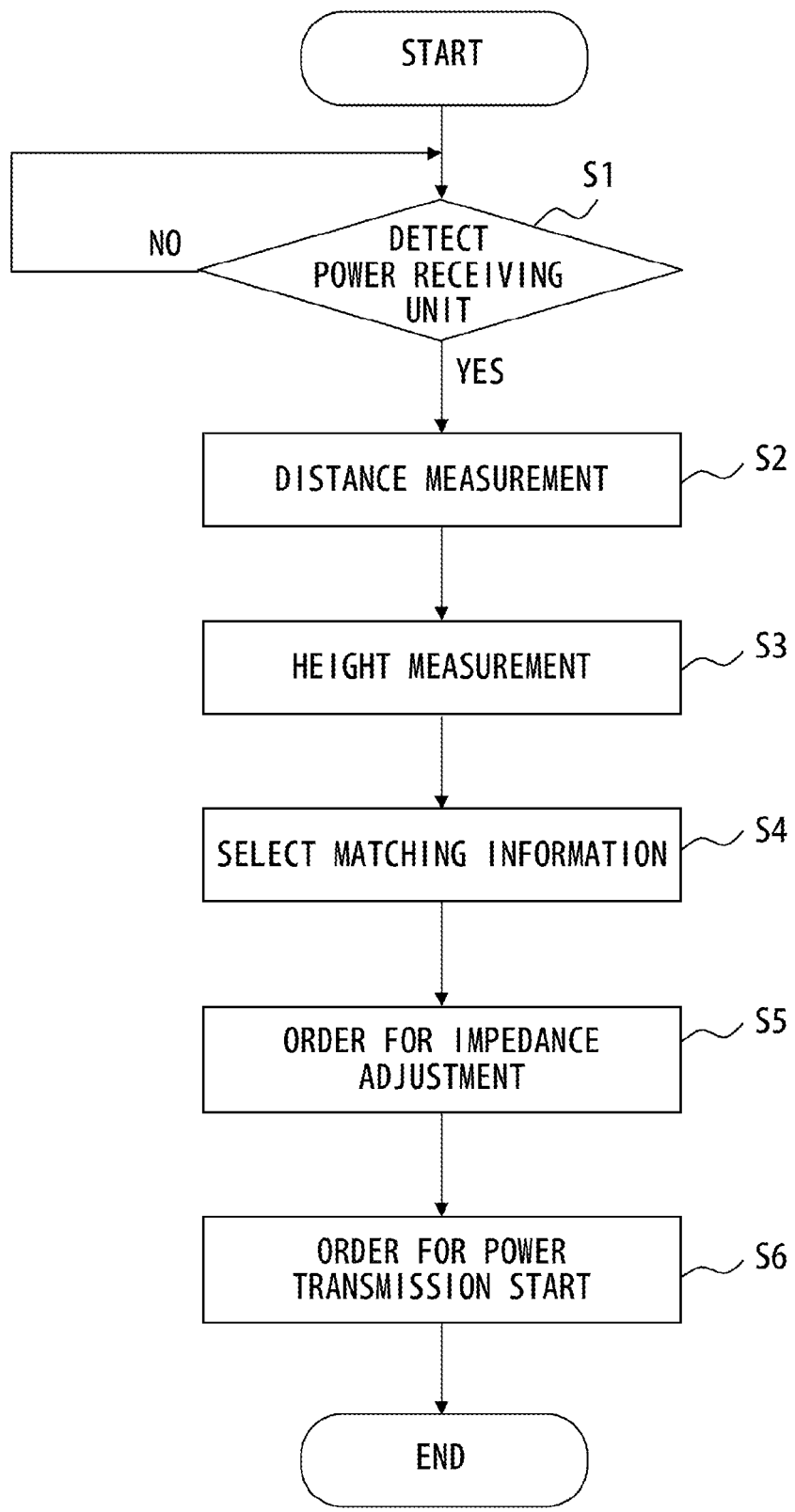
FIG. 4 is a diagram illustrating an example of the operation of a non-contact charging apparatus.

FIG. 4 is a diagram illustrating an example of the operation of the non-contact charging apparatus. In step S1, the control unit 8 detects that the power receiving unit 10 of the power receiving apparatus 2, and when an order for the charging start is detected, a shift to step S2 (Yes) is performed, and when it is not detected (No), await is performed. For example, a case in which the non-contact charging apparatus charges a power receiving apparatus mounted on a vehicle is explained.

Figure 5A:
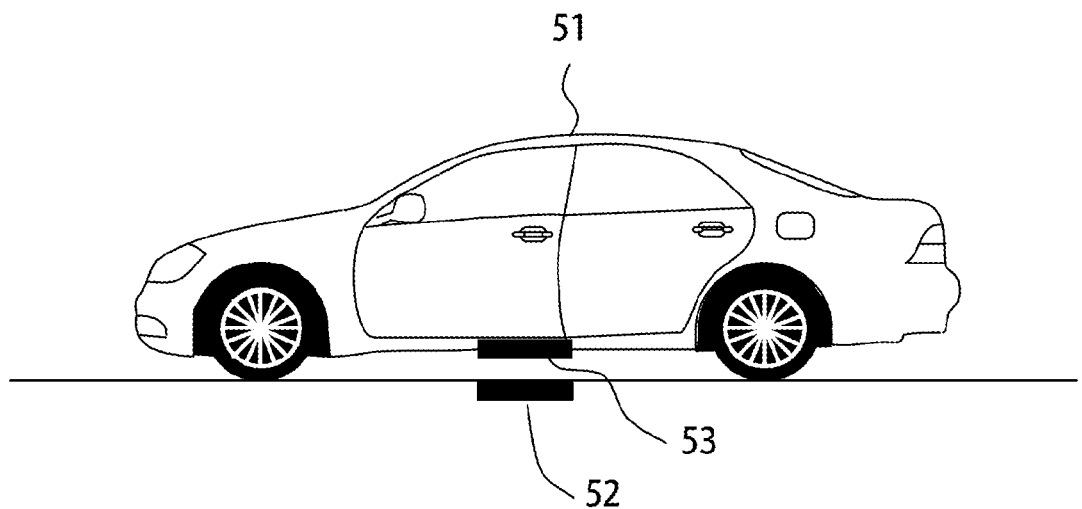

FIGS. 5A and 5B are diagrams illustrating an example of a non-contact charging apparatus that transmits power to a power receiving apparatus mounted on a vehicle or an electronic device.

The charging of a vehicle is explained. On a vehicle 51 illustrate in FIG. 5A, a power receiving apparatus 53 is mounted, and charges the power transmitted from a non-contact charging apparatus 52. When charging the battery of the power receiving apparatus 53 of the vehicle 51, after the completion of the parking at a prescribed position, the charging starts. As to whether or not the vehicle has been parked at a prescribed position, for example, using a sensor placed in the car park, whether the vehicle 51 is parked in a prescribed range is detected. As order of the charging start, for example, an Electronic Control Unit (ECU) of the vehicle 51 not illustrated in the drawing detects the switching-off of the ignition switch of the vehicle and the order for the charging start made by the user. Then, the ECU generates information regarding the charging start and transmits it to a communication unit of the vehicle 51 not illustrated in the drawing, and a notification of it is made to a communication unit of a charging station including the non-contact charging apparatus 52 and not illustrated in the drawing.

The charging of an electronic device is explained. To an electronic device 54 illustrated in FIG. 5B, a power receiving apparatus 56 is mounted, and power transmitted from a non-contact charging apparatus 55 is charged. When charging a battery of the power receiving apparatus 56 of the electronic device 54, after the non-contact charging apparatus 55 is placed on a prescribed position of the charging stand, the charging starts. As to whether or not the electronic device 54 has been placed on a prescribed position, for example, using a sensor placed in the charging stand, whether the electronic device 54 has been placed in a prescribed range is detected. As the order for the charging start, for example, the non-contact charging apparatus 55 detects the order of the charging start made by the user.

In step S2, when the control unit 8 obtains information regarding the charging start, the measurement of the distance D1 or the angle θ1 is ordered to the first measuring unit 6, and the first measuring unit 6 measures the distance D1 and the angle θ1. After that, the control unit 8 receives information regarding the measured distance D1 or angle θ1 from the first measuring unit 6. The first measuring unit 6 measures the distance D1, for example, using Ultra Wide Band communication or a laser length measuring device and the like. FIG. 6 is a diagram illustrating an example of the measurement of the distance D1. In FIG. 6, the center point of the circular power transmitting resonance coil 22 is placed on the origin, and the power receiving resonance coil 23 is placed with a shift in the X direction. Then, the line segment connecting a center point 61 of the power transmitting resonance coil 22 and a center point 62 of the power receiving resonance coil 23 is regarded as the distance D1. When the distance D1 is measured using Ultra Wide Band communication, a UWB antenna is placed at each of the center point 61 of the power transmitting resonance coil 22 and the center point 62 of the power receiving resonance coil 23, and the first measuring unit 6 obtains a signal that the UWB antenna has received, to obtain the distance D1 using the received signal. Meanwhile, the placement of the UWB antenna does not has to be on the center point, as long as the distance D1 may be obtained.

When the laser length measuring device is used, the laser length measuring device includes a light casting/receiving unit including a light casting unit and a light receiving unit on the center point 61 of the power transmitting resonance coil 22, and a movable unit that is capable of detecting the center point 62 of the power receiving resonance coil 23 and moving the light casting/receiving unit in the direction of the center point 62. The distance D1 is obtained using the result measured by the laser length measuring device. Meanwhile, the placement of the light casting/receiving unit does not has to be on the center point, as long as the distance D1 may be obtained.

Figure 7B:
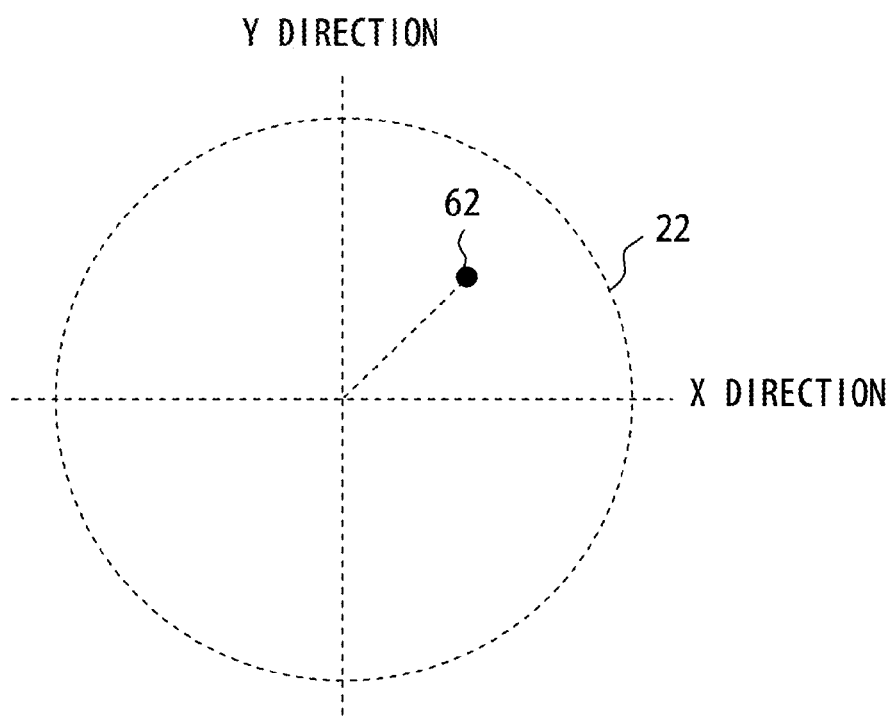

A case in which the first measuring unit 6 measures the angle θ1 is explained using FIGS. 7A and 7B. FIGS. 7A and 7B are diagrams illustrating an example of the measurement of the angle θ1. In FIG. 7A, the angle θ1 is measured by a method using an image capturing apparatus (a camera, a video). For example, a camera is attached to the non-contact charging device, and as illustrated in FIG. 7A, the image capturing apparatus captures the image of a mark and the like put on the position of the center point 62 of the power receiving resonance coil 23. Next, the image captured by the image capturing apparatus is analyzed by image processing to detect the mark. Next, using the position (the center point 62) of the mark in the image captured by the image capturing apparatus illustrated in FIG. 7B, the angle θ1 is obtained by known image processing. In addition, not only the angle θ1 but also the distance D1 may be obtained. Meanwhile, for the image capturing apparatus, a fish-eye lens and the like may also be used. Even with an image with some distortion from a lens such as a fish-eye lens, by correcting the distortion by image processing, the measurement of the angle θ1 or the distance D1 becomes possible. In addition, by making the mark a blinking LED and the like, it becomes possible to recognize it even during the night.

In step S3, the control unit 8 measures the distance D2 in the Z direction or obtains information of the distance D2 from distance information stored in the storing unit 9. In the case of measuring the distance D2, for example, using the second measuring unit 7, the distance between the plane (plain face) of the power transmitting resonance coil 22 and the plane (plain face) of the power receiving resonance coil 23 are actually measured. Meanwhile, when the non-contact charging apparatus and the power receiving apparatus are known in advance, the distance (height) in the Z axis direction may be determined by the shape of the power receiving apparatus having the power receiving resonance coil, and therefore, the distance in the Z axis direction may be determined by identifying the type of the power receiving apparatus. In that case, the second measuring unit 7 does not have to be provided. In the case of a vehicle, the vehicle type is identified, and the distance D2 in the Z axis direction between the non-contact charging apparatus and the power receiving apparatus is stored in association with respective vehicle types. For identifying the vehicle, for example, a method in which the image of the vehicle is captured by an image capturing apparatus (a camera, a video) and the vehicle type is identified by known image processing. In addition, to communicate with the vehicle to obtain, from the vehicle, information to identify the vehicle may be considered. In addition, in the case of an electronic device, communicating and obtaining, from the electronic device, information to identify the electronic device may be considered as well.

FIG. 8 is a diagram illustrating an example of the data structure of the distance information. Distance information 81 includes information to be stored in "IDENTIFICATION INFORMATION", "DISTANCE D2". In "IDENTIFICATION INFORMATION", information to identify the apparatus such as a vehicle, an electronic device and the like having the power receiving apparatus is stored. In this example, as "IDENTIFICATION INFORMATION", "ID1" "ID2" "ID3" "ID4" . . . and the like are stored. In "DISTANCE D2", in association with each identification information, the distance D2 in the Z axis direction between the non-contact charging apparatus and the power receiving apparatus is stored. In this example, as "DISTANCE D2", "kyori1z" "kyori2z" "kyori3z" "kyori4z" . . . and the like are stored.

Meanwhile, either of the processes of step S2 and step S3 may come first.

In step S4, the control unit 8 refers to the matching information and selects variable information, using the distance D1 and the distance D2 obtained in step S2 and step S3. Alternatively, matching information is referred to and variable information is selected, using the angle θ1 and the distance D2. FIG. 9 is a diagram illustrating an example of the data structure of the matching information. Matching information 91 includes information stored in "DISTANCE D1" "DISTANCE D2" "VARIABLE INFORMATION". As "DISTANCE D1", the distance between the center point of the power transmitting resonance coil 22 and the center point of the power receiving resonance coil 23 in a prescribed range is stored. In this example, as the distance D1, "kyori1"

"kyori2" ... "kyori6" "kyori7" ... and the like are stored. As "DISTANCE 2", the distance between the plane having the power transmitting resonance coil 22 and the plane having the power receiving resonance coil 23 is stored in association with each information of "DISTANCE D1". As "VARIABLE INFORMATION", information to vary the constant of the elements of the matching unit 4 to match the impedance of the power supply system and the impedance of the power transmitting/receiving system is stored. Here, the elements are the variable coil Lma, the variable capacitor Cma, the variable coil Lmb, the variable capacitor Cmb illustrated in FIG. 3B, and the like. In this example, "VARIABLE INFORMATION" includes information stored in "CAPACITANCE" "INDUCTANCE". In "CAPACITANCE", information to vary the capacitance of the matching unit 4 associated with "DISTANCE D1" and "DISTANCE D2" is stored. In this example, as information to vary the capacitance, "C11" "C12" ... "C21" "C22" ... "C61" "C62" ... "C71" "C72" ... are stored. In "INDUCTANCE", information to vary the inductance of the matching unit 4 associated with "DISTANCE D1" and "DISTANCE D2" is stored. In this example, as information vary the capacitance, "L11" "L12" ... "L21" "L22" ... "L61" "L62" ... "L71" "L72" ... are stored.

Matching information 92 includes information stored in "ANGLE θ1" "DISTANCE D2" "VARIABLE INFORMATION". As the difference from the matching information 91, variable information is selected using the angle θ1 and the distance D2 instead of the distance D1. As "ANGLE θ1", the angle between the Z axis the line segment connecting the center point of the power transmitting resonance coil 22 and the power receiving resonance coil 23 in a prescribed range is stored. In this example, as the angle θ1, "kakudo 1" "kakudo 2" ... "kakudo6" "kakudo7" ... and the like are stored. As "DISTANCE D2", the distance between the plane having the power transmitting resonance coil 22 and the power receiving resonance coil 23 is stored in association with each piece of information of "DISTANCE D1". In this example, as the distance D2, "kyori1z" "kyori2z" ... and the like are stored in association with each information of "ANGLE θ1". As "VARIABLE INFORMATION", information to vary the constant of the elements of the matching unit 4 to match the impedance of the power supply system and the impedance of the power transmitting/receiving system is stored. Here, the elements are the variable coil Lma, the variable capacitor Cma, the variable coil Lmb, the variable capacitor Cmb illustrated in FIG. 3B, and the like. In this example, "VARIABLE INFORMATION" includes information stored in "CAPACITANCE" "INDUCTANCE". In "CAPACITANCE", information to vary the capacitance of the matching unit 4 associated with "ANGLE θ1" and "DISTANCE D2" is stored. In this example, as information to vary the capacitance, "C11" "C12" ... "C21" "C22" ... "C61" "C62" ... "C71" "C72" ... are stored.

How to obtain variable information is explained.

Figure 10:
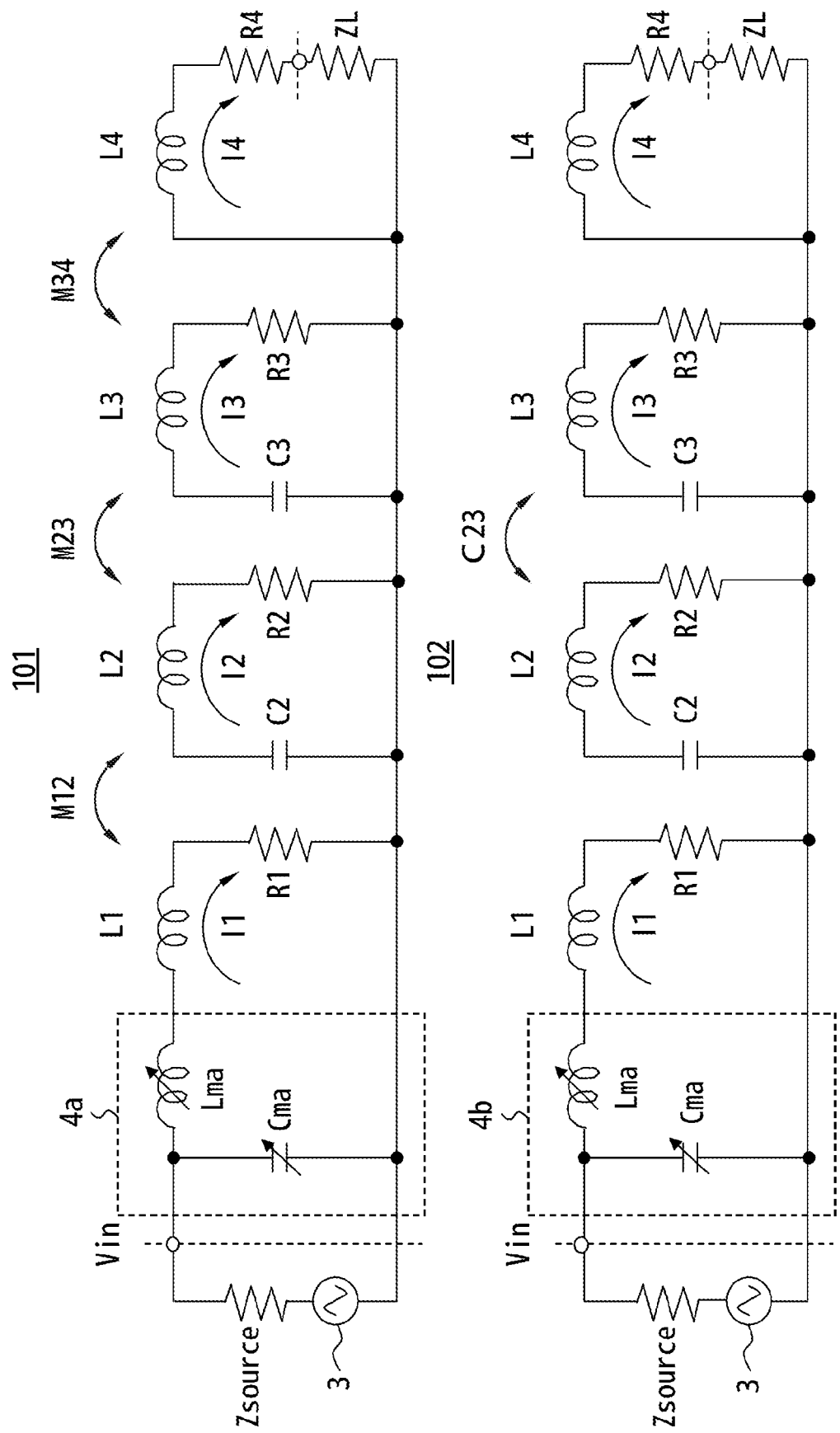
FIG. 10 is a diagram illustrating an example of an equivalent circuit of a non-contact charging system of magnetic field resonance and electric field resonance.

By analysing equivalent circuits 101, 102 illustrated in FIG. 10, and the like, using an electromagnetic field simulator and the like, the variable information is obtained. For example, various parameters such as the specifications (the shape, material and the like) of the circuit used in the power transmitting/receiving system, the shield, the relative positional relationship of the power transmitting/receiving system (the distance D1, the distance D2, the angle θ1) are input to the electromagnetic field simulator. Since they are known values except the distance D1 or the angle θ1 and the distance D2, the distance D1 or the angle θ1 and the distance D2 are respectively varied in a prescribed range, and the capacitance and the inductance with which the impedance of the power supply system and the impedance of the power transmitting/receiving system are calculated individually.

FIG. 10 is a diagram illustrating an example of an equivalent circuit of a non-contact charging system of magnetic field resonance and electric field resonance. The equivalent circuit 101 of FIG. 10 represents the non-contact charging system of field magnetic resonance using four coils explained in FIG. 2. The equivalent circuit 102 represents a non-contact charging system using electric field resonance using four coils.

The equivalent circuit 101 is explained. The circuit configured with the variable coil Lma and the variable capacitor Cma represents a circuit of the matching unit 4a. The circuit configured with a coil L1 and a resistance R1 is a circuit that includes the power supply coil 21 explained in FIG. 2. The circuit configured with a coil L2 and a capacitor C2 and a resistance R2 is a circuit that includes the power transmitting resonance coil 22 illustrated in FIG. 2, and the like. The circuit configured with a coil L3 and a capacitor C3 and a resistance R3 is a circuit that includes the power receiving resonance coil 23 illustrated in FIG. 2. The circuit configured with a coil L4 and a resistance R4 and the load ZL is a circuit that includes the power taking out coil 24 and the load ZL explained in FIG. 2. The resistance Z source represents the impedance of the power supply system. In addition, in the equivalent circuit 101, a mutual inductance M12 of the coil L1 and the coil L2, a mutual inductance M23 of the coil L2 and the coil L3, a mutual inductance M34 of the coil L3 and the coil L4. In addition, currents I1 through I4 are illustrated.

The equivalent circuit 102 is explained. The circuit configured with the variable coil Lmb and the variable capacitor Cmb represents a circuit of the matching unit 4a. The circuit configured with a coil L1 and a resistance R1 is a circuit that includes the power supply coil 21 explained in FIG. 2. The circuit configured with a coil L2 and a capacitor C2 and a resistance R2 is a circuit that includes the power transmitting resonance coil 22 illustrated in FIG. 2, and the like. The circuit configured with a coil L3 and a capacitor C3 and a resistance R3 is a circuit that includes the power receiving resonance coil 23 illustrated in FIG. 2. The circuit configured with a coil L4 and a resistance R4 and the load ZL is a circuit that includes the power taking out coil 24 and the load ZL explained in FIG. 2. The resistance Z source represents the impedance of the power supply system. In addition, in the equivalent circuit 102, a mutual capacitance C23 the capacitor C2 and the capacitor C3 and, currents I1 through I4 are illustrated.

Information corresponding to the capacitance and the inductance obtained using a simulator as described above is stored in the variable information.

Meanwhile, in the system of magnetic field resonance or electric field resonance, in a case in which the circuit configured with the coil L1 and the resistance R1 is not used or when the circuit configured with the coil L4 and the resistance R4 is not used, an equivalent circuit is created as well. Then, determining the variable information using a simulator and the like with respect to the created equivalent circuit may be considered.

Meanwhile, in step S4, the control unit 8 refers to the matching information 91 and selects the variable information associated with the distance D1 and distance D2 obtained in step S2 and step S3. Alternatively, the matching information 92 is referred to and the variable information associated with the angle θ1 and the distance D2 is selected, using the angle θ1 and the distance D2.

In step S5, the control unit 8 transmits a control signal to the matching unit 4 to make it perform impedance matching.

When controlling the matching unit 4a in FIG. 3A, information to vary the inductance of the variable coil Lma and the capacitance of the variable capacitor Cma is generated, and a control signal including the information is transmitted to the variable coil Lma and the variable capacitor Cma.

In step S6, when the control unit 8 detects that the impedance matching has been made, an order for the start of power transmission is transmitted to the power supply unit 3. After that, the power supply unit 3 outputs a prescribed power.

Effects are explained.

According to the present embodiment, since six degrees of freedom of the power transmitting/receiving system become known, a highly accurate matching adjustment becomes possible. Furthermore, by limiting the parameter to be actually measured to one, error factors due to the actual measurement may be reduced, and a highly accurate matching adjustment becomes possible. As a result, an effect of suppressing the reflected power of the power supply system and the power transmitting/receiving system is obtained.

In addition, it becomes possible to increase the efficiency and to avoid EMI. For this reason, it also becomes possible to avoid the issue of the power source supply system being broken in a large power system.

Figure 11A:
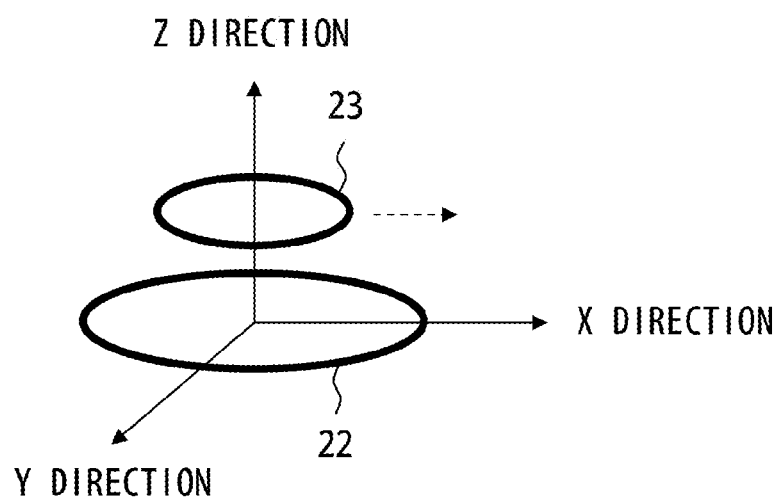
FIGS. 11A and 11B are diagrams illustrating the impedance, the reflected power and the efficiency in a case in which a power receiving resonance coil move in the X direction.
Figure 11B:
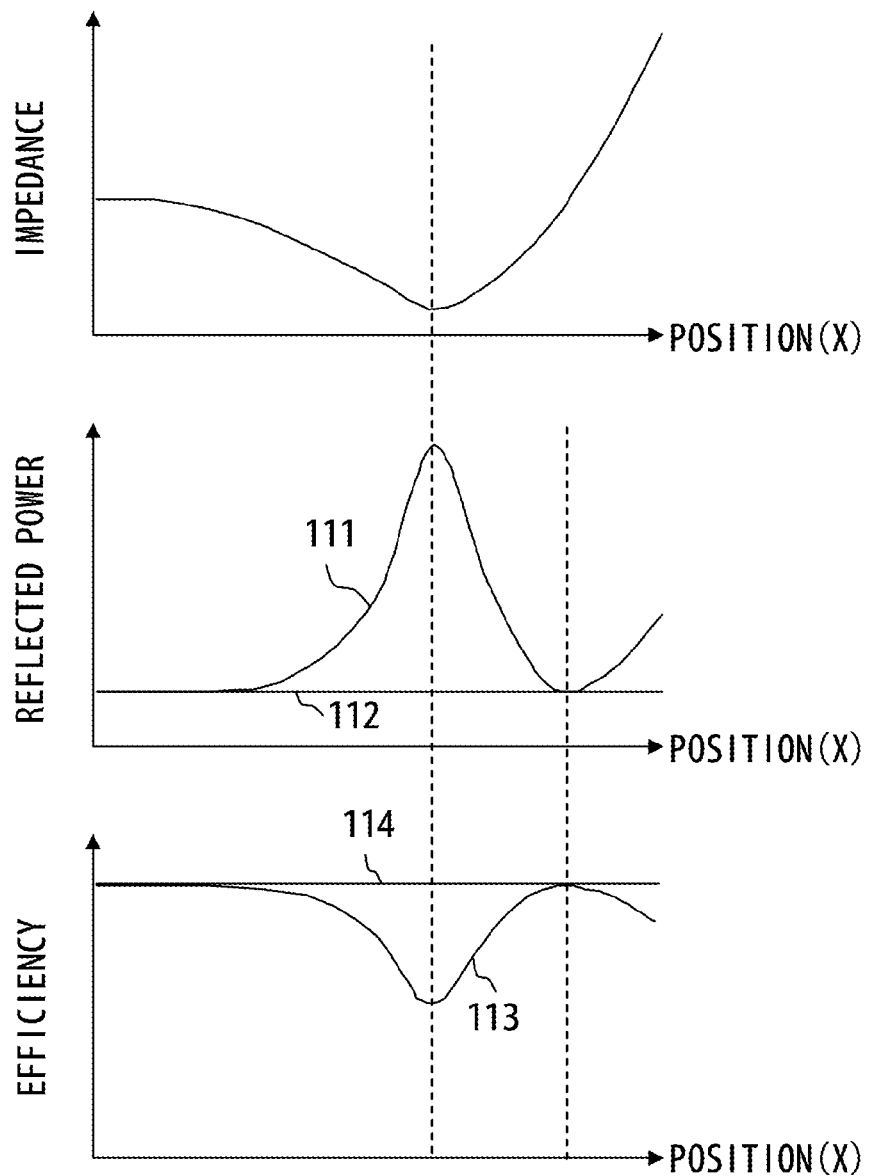
Figure 12B:
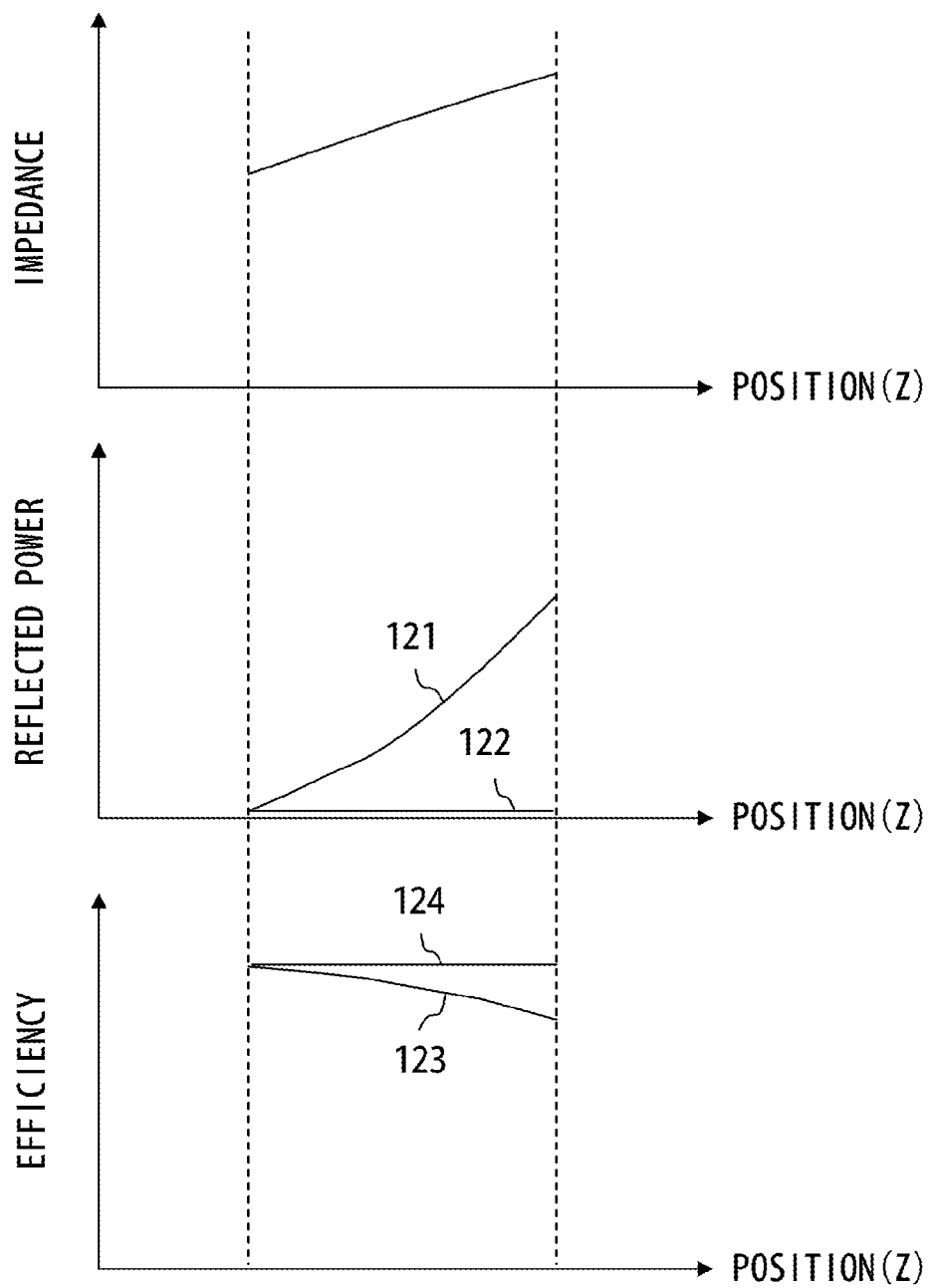

FIGS. 11A and 11B are diagrams illustrating the impedance and the reflected power and the efficiency in a case in which the power receiving resonance coil moves in the X direction. FIGS. 12A and 12B are diagrams illustrating the impedance and the reflected power and the efficiency in a case in which the power receiving resonance coil 23 moves in the Z direction.

When the power receiving resonance coil 23 is shifted in the X direction as illustrated in FIG. 11A, the impedance of the power transmitting/receiving system from the viewpoint of the power supply system changes as illustrated in FIG. 11B. Then, in a case in which the impedance matching is not made, the reflected power coming back from the power transmitting/receiving system to the power supply system changes as illustrated by a curved line segment 111. In addition, when the impedance matching is not made, a curved line segment 113 representing the efficiency expressed by the power input to the power supply system and the power input to the battery of the power transmitting/receiving system also changes. However, when the impedance matching is made according to the present embodiment, the reflected power also becomes constant as illustrated by a curved line segment 112, and the efficiency also becomes constant as illustrated by a curved line segment 114.

Meanwhile, When the power receiving resonance coil 23 is shifted in the Z direction as illustrated in FIG. 12A, the impedance of the power transmitting/receiving system from the view point of the power supply system changes as illustrated in FIG. 12B changes. Then, in a case in which the impedance matching is not made, the reflected power coming back from the power transmitting/receiving system to the power supply system changes as illustrated by a curved line segment 121. In addition, when the impedance matching is not made, a curved line segment 123 representing the efficiency expressed by the power input to the power supply system and the power input to the battery of the power transmitting/receiving system also changes. However, when the impedance matching is made according to the present embodiment, the reflected power also becomes constant as illustrated by a curved line segment 122, and the efficiency also becomes constant as illustrated by a curved line segment 124.

Embodiment 2 is explained.

In embodiment 2, unlike embodiment 1, the variable information is obtained by calculation, without storing the matching information in the storing unit 9.

Figure 13:
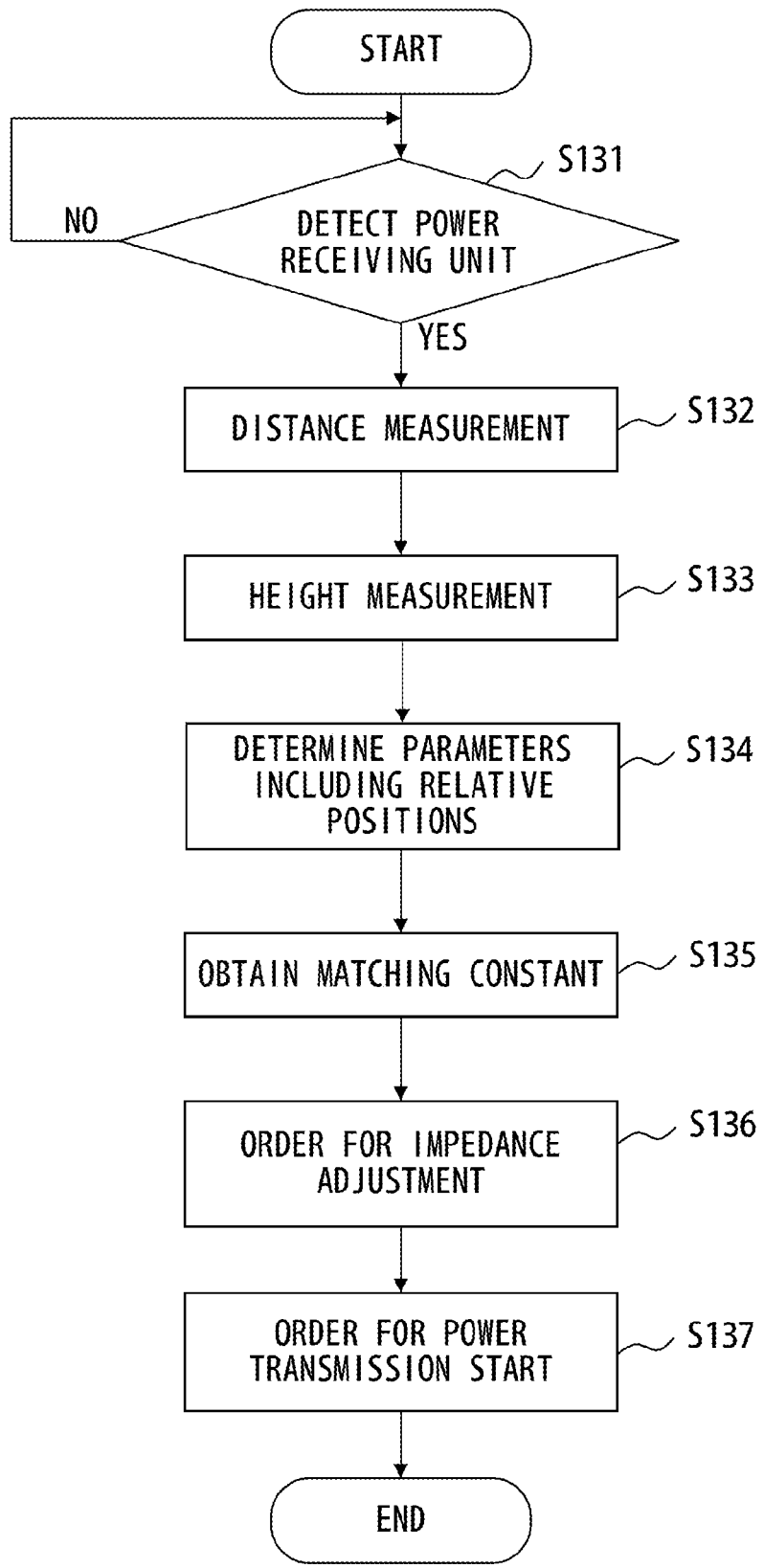
FIG. 13 is a diagram illustrating an example of the operation of a non-contact charging apparatus of embodiment 2.

FIG. 13 is a diagram illustrating an example of an operation of a non-contact charging apparatus of embodiment 2. Since steps S131-S133, steps S136, S137 are the same processes as steps S1-3, steps S6, S7, explanation for them is omitted.

In step S134, the control unit 8 determines the parameters for executing a simulation. For example, various parameters such as the specifications (the shape, material, and the like) of the equivalent circuit used in the power transmitting/receiving system, the shield, the relative positional relationship of the power transmitting/receiving system (the distance D1, the distance D2, the angle θ1), and the like, are input to an electromagnetic field simulator.

In step S135, the control unit 8 executes a simulation using an electromagnetic field simulator and the like, varies the distance D1 or the angle θ1 and the distance D2 in a prescribed range respectively, and obtains the capacitance and the inductance. The variable information is generated using the obtained capacitance and the inductance.

According to the present embodiment, since six degrees of freedom of the power transmitting/receiving system become known, a highly accurate matching adjustment becomes possible. Furthermore, by limiting the parameter to be actually measured to one, error factors due to the actual measurement may be reduced, and a highly accurate matching adjustment becomes possible. As a result, an effect of suppressing the reflected power of the power supply system and the power transmitting/receiving system is obtained. In addition, it becomes possible to increase the efficiency and to avoid EMI. For this reason, it also becomes possible to avoid the issue of the power source supply system being broken in a large power system.

Meanwhile, the present invention is not limited to the embodiments described above, and various improvements, changes may be made without departing from the scope of the present invention.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments) of the present invention have been described in detail, it should be understood that the various changes, substitutions, and alterations could be made hereto without departing from the spirit and scope of the invention.

What is claimed is:

1. A non-contact charging apparatus comprising:
   a matching unit configured to match an impedance of a power supply system that supplies alternate current power and an impedance of a power transmitting/receiving system comprising a power transmitting unit and a power receiving apparatus;
   a measuring unit configured to measure a first distance representing a length of a line segment connecting a position of a center point of a power transmitting resonance coil in a shape in axial symmetry in the power transmitting unit and a position of a center point of a power receiving resonance coil in a shape in axial symmetry in the power receiving apparatus; and
   a control unit configured to refer to distance information stored in a storing unit and comprising identification information to identify a plurality of apparatuses comprising the power receiving apparatus and a second distance that is a distance between a plane comprising the power transmitting resonance coil and a plane comprising the power receiving resonance coil determined according to each type of the apparatus and that is associated with each of the identification information by using information to identify an apparatus which comprises the power receiving apparatus, and to select the second distance, to refer to matching information stored in the storing unit and comprising a combination of the first distance and the second distance and variable information for varying an inductance and a capacitance of the matching unit for matching the impedance of the power supply system associated with the combination of the first distance and the second distance and the impedance of the power transmitting/receiving system that changes according to relative positions of the power transmitting resonance coil and the power receiving resonance coil by using the first distance and the second distance, and to select the variable information, and to vary the inductance and the capacitance of the matching unit according to the variable information.

2. The non-contact charging apparatus according to claim 1, wherein:

the measuring unit measures an angle between a line segment connecting the position of the center point of the power transmitting resonance coil in a shape in axial symmetry in the power transmitting unit and the position of the center point of the power receiving resonance coil in a shape in axial symmetry in the power receiving apparatus, and a line segment that is an axis of the axial symmetry from the center point of the power transmitting resonance coil; and the control unit refers to, using the angle and the second distance, matching information stored in the storing unit and comprising, a combination of the angle and the second distance, and variable information to vary the inductance and the capacitance of the matching unit for matching the impedance of the power supply system and the impedance of the power transmitting/receiving system that changes according to relative positions of the power transmitting resonance coil and the power receiving resonance coil, and selects the variable information.

3. The non-contact charging apparatus according to claim 1, wherein the matching unit is a matching circuit comprising a variable inductor or a variable capacitor.

4. A non-contact charging method comprising:

obtaining, by a measuring unit, a first distance representing a length of a line segment connecting a position of a center point of a power transmitting resonance coil in a shape in axial symmetry in a power transmitting unit and a position of a center point of a power receiving resonance coil in a shape in axial symmetry in a power receiving apparatus;

referring, by a control unit, to distance information stored in a storing unit and comprising identification information to identify a plurality of apparatuses comprising the power receiving apparatus and a second distance that is a distance between a plane comprising the power transmitting resonance coil and a plane comprising the power receiving resonance coil determined according to each type of the apparatus and that is associated with each of the identification information by using information to identify an apparatus which comprises the power receiving apparatus, and selecting the second distance;

referring, by the control unit, to matching information stored in the storing unit and comprising a combination of the first distance and the second distance and variable information for varying an inductance and a capacitance of the matching unit for matching an impedance of a power supply system associated with the combination of the first distance and the second distance and an impedance of the power transmitting/receiving system that changes according to relative positions of the power transmitting resonance coil and the power receiving resonance coil by using the first distance and the second distance, and selecting the variable information; and varying, by the control unit, the inductance and the capacitance of the matching unit configured to match an impedance of a power supply system that supplies alternate current power and an impedance of a power transmitting/receiving system comprising the power transmitting unit and the power receiving apparatus, according to the variable information.

5. The non-contact charging method according to claim 4, comprising:

obtaining, by the measuring unit, an angle between a line segment connecting the position of the center point of the power transmitting resonance coil in a shape in axial symmetry in the power transmitting unit and the position of the center point of the power receiving resonance coil in a shape in axial symmetry in the power receiving apparatus, and a line segment that is an axis of the axial symmetry from the center point of the power transmitting resonance coil; and referring, by the control unit to, using the angle and the second distance, matching information stored in the storing unit and comprising, a combination of the angle and the second distance, and variable information to vary the inductance and the capacitance of the matching unit for matching the impedance of the power supply system and the impedance of the power transmitting/receiving system that changes according to relative positions of the power transmitting resonance coil and the power receiving resonance coil, and selecting the variable information.

* * * * *